(12) United States Patent
Araki et al.

(10) Patent No.: US 10,121,764 B2
(45) Date of Patent: Nov. 6, 2018

(54) METHOD FOR FORMING BALL IN BONDING WIRE

(71) Applicants: NIPPON MICROMETAL CORPORATION, Saitama (JP); NIPPON STEEL & SUMIKIN MATERIALS CO., LTD., Tokyo (JP)

(72) Inventors: Noritoshi Araki, Saitama (JP); Takashi Yamada, Saitama (JP); Teruo Haibara, Saitama (JP); Ryo Oishi, Saitama (JP); Tomohiro Uno, Tokyo (JP)

(73) Assignees: Nippon Micrometal Corporation, Saitama (JP); Nippon Steel & Sumikin Materials Co., Ltd., Tokyo (JP)

( * ) Notice: Subject to any disclaimer, the term of this patent is extended or adjusted under 35 U.S.C. 154(b) by 0 days.

(21) Appl. No.: 15/569,603

(22) PCT Filed: Apr. 14, 2016

(86) PCT No.: PCT/JP2016/062041
§ 371 (c)(1),
(2) Date: Oct. 26, 2017

(87) PCT Pub. No.: WO2016/175040
PCT Pub. Date: Nov. 3, 2016

(65) Prior Publication Data
US 2018/0096965 A1    Apr. 5, 2018

(30) Foreign Application Priority Data
Apr. 30, 2015    (JP) .................................. 2015-093218

(51) Int. Cl.
*B23K 31/02*    (2006.01)
*B23K 35/22*    (2006.01)
(Continued)

(52) U.S. Cl.
CPC ............ *H01L 24/85* (2013.01); *B23K 20/007* (2013.01); *H01L 24/43* (2013.01); *H01L 24/45* (2013.01);
(Continued)

(58) Field of Classification Search
CPC ........ B23K 31/02; B23K 35/22; B23K 35/30; B23K 35/302; B23K 35/3093; H01L 24/03; H01L 24/11–24/33
(Continued)

(56) References Cited

U.S. PATENT DOCUMENTS

| 8,389,860 B2 * | 3/2013 | Uno .................. B23K 35/0222 |
| | | 174/102 R |
| 2009/0188696 A1 * | 7/2009 | Uno ..................... B23K 20/004 |
| | | 174/126.2 |

(Continued)

FOREIGN PATENT DOCUMENTS

| JP | 2008-130825 A | 6/2008 |
| JP | 4158928 B2 | 10/2008 |

(Continued)

OTHER PUBLICATIONS

International Search Report issued in corresponding International Patent Application No. PCT/JP2016/062041, dated Jul. 5, 2016.

*Primary Examiner* — Michael LaFlame, Jr.
(74) *Attorney, Agent, or Firm* — McDermott Will & Emery LLP

(57) ABSTRACT

The present invention provides a ball forming method for forming a ball portion at a tip of a bonding wire which includes a core material mainly composed of Cu, and a coating layer mainly composed of Pd and formed over a surface of the core material, wherein the ball portion is formed in non-oxidizing atmosphere gas including hydrocarbon which is gas at room temperature and atmospheric (Continued)

pressure, the method being capable of improving Pd coverage on a ball surface in forming a ball at a tip of the Pd-coated Cu bonding wire.

11 Claims, 1 Drawing Sheet

(51) Int. Cl.
 *B23K 35/30* (2006.01)
 *H01L 23/00* (2006.01)
 *B23K 20/00* (2006.01)
(52) U.S. Cl.
 CPC ............ *H01L 24/48* (2013.01); *H01L 24/745* (2013.01); *H01L 24/78* (2013.01); *H01L 2224/43125* (2013.01); *H01L 2224/4556* (2013.01); *H01L 2224/45144* (2013.01); *H01L 2224/45147* (2013.01); *H01L 2224/45565* (2013.01); *H01L 2224/45572* (2013.01); *H01L 2224/45644* (2013.01); *H01L 2224/45664* (2013.01); *H01L 2224/48463* (2013.01); *H01L 2224/745* (2013.01); *H01L 2224/781* (2013.01); *H01L 2224/78268* (2013.01); *H01L 2224/78301* (2013.01); *H01L 2224/85045* (2013.01); *H01L 2224/85054* (2013.01); *H01L 2224/85065* (2013.01); *H01L 2224/85075* (2013.01); *H01L 2924/00011* (2013.01); *H01L 2924/00014* (2013.01)

(58) Field of Classification Search
 USPC .................. 219/50, 56–56.22, 146.1, 146.22
 See application file for complete search history.

(56) References Cited

U.S. PATENT DOCUMENTS

2010/0213619 A1    8/2010  Uno et al.
2013/0306352 A2*  11/2013  Terashima ................ C22C 5/02
                                                                   174/126.2
2015/0322586 A1*  11/2015  Lyn .................... B23K 35/0272
                                                                   428/613

FOREIGN PATENT DOCUMENTS

JP       2009-105114 A    5/2009
JP       2014-075519 A    4/2014
JP          5592029 B2    9/2014
WO     2008/087922 A1    7/2008

* cited by examiner

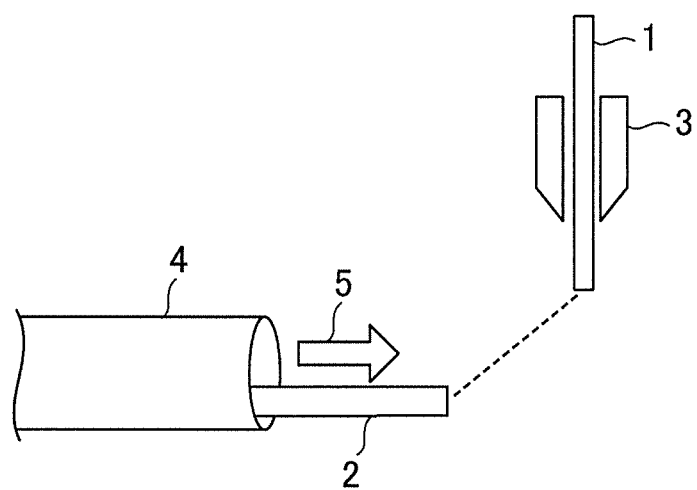

METHOD FOR FORMING BALL IN BONDING WIRE

CROSS REFERENCE

This application is the U.S. National Phase under 35 U.S.C. § 371 of International Application No. PCT/JP2016/062041, filed on Apr. 14, 2016, which claims the benefit of Japanese Application No. 2015-093218, filed on Apr. 30, 2015, the entire contents of each are hereby incorporated by reference.

TECHNICAL FIELD

The present invention relates to a ball forming method for forming a ball portion on a tip of a bonding wire.

BACKGROUND ART

With soaring resource price, Cu has come to be used instead of Au as a material for bonding wires. As a bonding wire using Cu as a material, a Pd-coated Cu bonding wire is known, where the Pd-coated Cu bonding wire is produced by coating a core material mainly composed of Cu with Pd (e.g., Patent Literature 1).

A thermosonic bonding process is used commonly to join a bonding wire. This process involves passing the bonding wire through a jig called a capillary, heat-melting a wire tip by arc heat input, forming a free air ball (hereinafter also referred to simply as a "ball portion" or "FAB") by surface tension, then pressure-bonding the ball portion onto an electrode of a semiconductor element heated in a range of 150 to 300° C., and then bonding the bonding wire directly on the side of an external lead by ultrasonic bonding.

In forming a ball portion on the tip of the Pd-coated Cu bonding wire, it is necessary to use a non-oxidizing atmosphere to prevent oxidation of the ball portion. Specifically, it is common practice to form the ball portion in non-oxidizing atmosphere gas made up of pure nitrogen, argon, or nitrogen containing approximately 5 vol % of hydrogen (e.g., Patent Literatures 2 to 5).

CITATION LIST

Patent Literature

Patent Literature 1: Japanese Patent No. 4158928
Patent Literature 2: Japanese Patent No. 5592029
Patent Literature 3: Japanese Patent Laid-Open No. 2014-75519
Patent Literature 4: Japanese Patent Laid-Open No. 2009-105114
Patent Literature 5: Japanese Patent Laid-Open No. 2008-130825

SUMMARY OF INVENTION

Technical Problem

However, when a ball portion is formed on the tip of the Pd-coated Cu bonding wire in the non-oxidizing atmosphere gas, Pd may become distributed unevenly, producing such a part that is not coated with Pd on a surface of the ball portion (hereinafter also referred to as a "ball surface"). That part of the ball portion which is not coated with Pd may cause strength degradation or increased electrical resistance in bonding between the ball portion and electrode.

Thus, an object of the present invention is to provide a ball forming method capable of improving Pd coverage on a ball surface in forming a ball at a tip of a Pd-coated Cu bonding wire.

Solution to Problem

The present invention provides a ball forming method for forming a ball portion at a tip of a bonding wire which includes a core material mainly composed of Cu, and a coating layer mainly composed of Pd and formed over a surface of the core material, wherein the ball portion is formed in non-oxidizing atmosphere gas including hydrocarbon which is gas at room temperature and atmospheric pressure.

Advantageous Effects of Invention

According to the present invention, because the hydrocarbon in the non-oxidizing atmosphere gas generates heat as a result of arc discharges, heat is transmitted more uniformly to surroundings of the wire tip. As the tip is melted by the heat, it is possible to form the ball portion with improved Pd coverage on the ball surface.

BRIEF DESCRIPTION OF THE DRAWING

FIG. 1 is a schematic block diagram showing a configuration of the wire bonding machine used in the present embodiment.

DESCRIPTION OF EMBODIMENT

An embodiment of the present invention will be described in detail below. First, a configuration of a bonding wire applied to a ball forming method according to the present embodiment will be described.

The bonding wire includes a core material mainly composed of Cu and a coating layer mainly composed of Pd and formed over a surface of the core material. Preferably the core material is formed of copper with a purity of 98 mass % or above. An outside diameter of the core material is not particularly limited, but preferably is 15 to 50 µm. The coating layer is a region with a Pd concentration of 50 at % or above, and preferably is 0.015 to 0.15 µm in thickness.

In the bonding wire configured in this way, the coating layer made of Pd is provided over the surface of the core material made of Cu, making it possible to prevent oxidation of the core material.

In the bonding wire, a skin layer containing Au may be further formed over a surface of the coating layer. The skin layer is a region with a Au concentration of 10 at % or above, and preferably is 0.0005 to 0.05 µm in thickness.

Next, a method for producing the bonding wire according to the present embodiment will be described. The bonding wire can be produced by a common method. The bonding wire can be obtained by processing a base metal mainly composed of Cu into a thin wire, forming a coating layer and skin layer, and performing heat treatment. After the coating layer is formed, wire drawing and heat treatment may be performed again.

The base metal which is to become the core material is obtained by melting and then solidifying Cu serving as a raw material, together with elements added as required. An arc furnace, high-frequency furnace, resistance heating furnace, or the like can be used for the melting. To prevent incorporation of gases such as atmospheric $O_2$, $N_2$, and $H_2$, preferably melting is done in a vacuum atmosphere or in an inert atmosphere of $N_2$, Ar, or another gas.

Methods for forming the coating layer and skin layer over the surface of the core material include a plating method, vapor deposition method, fusion method, and the like. Regarding the plating method, either an electrolytic plating process or electroless plating process can be used. Electrolytic plating processes called strike plating and flash plating have high plating rates and provide good adhesion to undercoating. Solutions used for electroless deposition are classified into a substitution type and reduction type. Substitution plating alone is enough for a small thickness, but for a large thickness, it is useful to apply reduction plating in stages after substitution plating.

Regarding the vapor deposition method, physical adsorption such as a sputtering process, an ion plating process, and vacuum deposition as well as chemical absorption such as plasma CVD are available for use. Any of the processes is a dry type, which eliminates the need for cleaning after formation of the coating layer and skin layer, and thus there is no need to worry about surface contamination during cleaning.

In forming the coating layer and skin layer, either of the following techniques is effective: a technique for forming the layers after the wire is drawn to a final wire diameter and a technique for forming the layers over a large-diameter Cu alloy core material and then repeating wire drawing multiple times until a desired wire diameter is obtained. The former technique, which forms the coating layer and skin layer using the final wire diameter, makes production and quality control simple and easy. The latter technique, which combines formation of the coating layer and skin layer with wire drawing, is advantageous in improving adhesion to the core material. Concrete examples of the formation techniques include a technique for forming the coating layer and skin layer over the core material of the final wire diameter by continuously running the wire in a electrolytic plating solution and a technique for forming the coating layer and skin layer over a thick core material by immersing the thick core material in an electrolytic or electroless plating bath and then drawing the wire to a final wire diameter.

After the coating layer and skin layer are formed, heat treatment may be performed. Heat treatment causes atoms to diffuse among the skin layer, coating layer, and core material, improving adhesion strength and inhibiting separation of the skin layer and coating layer during processing, and thus is effective in improving productivity. To prevent incorporation of atmospheric $O_2$, preferably melting is done in a vacuum atmosphere or in an inert atmosphere of $N_2$, Ar, or another gas.

Next, with reference to FIG. 1, description will be given of the ball forming method according to the present embodiment for forming a ball portion at the tip of the bonding wire configured as described above. A wire bonding machine shown in FIG. 1 includes a capillary 3 adapted to feed a bonding wire 1, a discharge torch 2, and a gas nozzle 4. The discharge torch 2 produces an arc discharge between the discharge torch 2 and the tip of the bonding wire 1 fed a predetermined length from a tip of the capillary 3, thereby melting the wire tip, and forms the ball portion. The gas nozzle 4 blows non-oxidizing atmosphere gas 5 around the wire tip and discharge torch 2 and thereby forms a non-oxidizing atmosphere. Size of the ball portion formed in this way can be 1.7 to 2.0 times the bonding wire diameter although not particularly limited.

The non-oxidizing atmosphere gas 5 supplied from the gas nozzle 4 includes hydrocarbon which is gas at room temperature and atmospheric pressure. Regarding the non-oxidizing atmosphere gas 5, the hydrocarbon in the non-oxidizing atmosphere gas generates heat by means of the arc discharge produced between the discharge torch 2 and bonding wire 1. Consequently, heat is transmitted more uniformly to surroundings of the wire tip, melting the tip and thereby forming a ball portion. This makes it possible to form the ball portion with improved Pd coverage on the ball surface. A concentration range of the hydrocarbon can be set appropriately based on an amount of heat to be obtained. Preferably the non-oxidizing atmosphere gas 5 includes the hydrocarbon in a range of 0.08 to 12.50 vol % and a balance is made up of nitrogen. Also, preferably the non-oxidizing atmosphere gas 5 is supplied from the gas nozzle at a flow rate of 0.3 to 0.8 L/min.

Preferably a carbon number of the hydrocarbon is 1 to 4. As the hydrocarbon, one or more of methane, ethane, propane, and butane can be selected. When methane is selected, its concentration can be adjusted appropriately in a range of 0.25 to 12.50 vol %, and more preferably in a range of 1.25 to 12.50 vol %. When ethane is selected, its concentration can be adjusted appropriately in a range of 0.14 to 7.00 vol %, and more preferably in a range of 0.70 to 7.00 vol %. When propane is selected, its concentration can be adjusted appropriately in a range of 0.10 to 5.00 vol %, and more preferably in a range of 0.50 to 5.00 vol %. When butane is selected, its concentration can be adjusted appropriately in a range of 0.08 to 4.00 vol %, and more preferably in a range of 0.40 to 4.00 vol %. When the concentration of hydrocarbon is lower than the lower limit of the above-mentioned range, the effect of improving the Pd coverage on the ball surface is not available, and when the upper limit of the above-mentioned range is exceeded, sphericity of the ball portion falls.

Preferably, the non-oxidizing atmosphere gas 5 further includes hydrogen. When the non-oxidizing atmosphere gas 5 includes hydrocarbon and hydrogen, arc discharges are stabilized, making it possible to form ball portions with improved Pd coverage on the ball surfaces and improve the sphericity of the ball portions. The effect of improving the sphericity of the ball portions is available when hydrogen concentration in the non-oxidizing atmosphere gas 5 is 1.0 vol % or above. The concentration of hydrogen can be adjusted appropriately in a range of 1.0 to 5.0 vol %, and more preferably in a range of 2.5 to 5.0 vol %. Also, it is considered that the effect of improving the sphericity of the ball portions is saturated when hydrogen concentration in the non-oxidizing atmosphere gas 5 is 5.0 vol %.

EXAMPLES

Examples will be described below. First, an ingot which was to become the core material was produced by melting Cu used as a raw material. A high-purity Cu wire thinned down to a certain wire diameter was prepared as a core material and a Pd covering layer and Au skin layer were formed over the surface of the wire by an electrolytic plating method. The electrolytic plating solution used was a commercially available plating solution for semiconductor applications. Subsequently, the wire was drawn to a final wire diameter and finally heat treatment was applied to remove processing strain. Die drawing was carried out down to a wire diameter of 30 to 100 μm as required, then diffusion heat treatment was applied, and then a drawing process was applied further. Consequently, bonding wires with an outside diameter of 18 μm or 20 μm, a coating layer thickness of 0.06 μm, and a skin layer thickness of 0.003 μm were created.

To form the ball portion, a commercially available automatic wire bonder (an IConn model produced by K&S) was used. With the current for the discharge torch fixed at 60 mA, the discharge duration was adjusted such that the FAB diameter would be 1.7 to 2.0 times the wire diameter. The flow rate of the non-oxidizing atmosphere gas was 0.4 to 0.6 L/min. The Pd distribution on the surface of the formed ball portion and the formed ball shape were evaluated.

The Pd distribution was evaluated as follows: 50 ball portions whose ratio of the ball diameter to the wire diameter was 1.7 to 2.0 were sampled, the ball portions were embedded in resin and polished, ball sections in the longitudinal direction of the wire were thereby exposed and observed under an optical microscope, and the coverage of the surface of the ball portions with the coating layer was measured and the average value of 50 ball portions was calculated for evaluation. When the coverage was less than 50%, an x mark was given, meaning defectiveness, when the coverage was no less than 50% and less than 70%, a triangle mark was given by judging that there were no significant problems in practical use, when the coverage was no less than 70% and less than 90%, a single circle mark was given, and when the coverage was no less than 90%, a double circle mark was given, indicating that the Pd distribution was good. These marks were entered in the "Pd distribution" fields of Tables 1 to 4.

The ball shape was evaluated as follows: 50 ball portions whose ratio of the ball diameter to the wire diameter was 1.7 to 2.0 were sampled and observed under a scanning electron microscope (SEM), and the sphericity of the ball portions were evaluated. When there were five or more balls of deformed shape, an x mark was given, meaning defectiveness, when there were three or four deformed shapes, a triangle mark was given by judging that there were no significant problems in practical use, when there were one or two deformed shapes, a single circle mark was given, and when there was no deformed shape, a double circle mark was given, indicating that the ball formation was good. These marks were entered in the "FAB shape" fields of Tables 1 to 4.

Bonding wires with an outside diameter of 18 μm, a coating layer thickness of 0.06 μm, and a skin layer thickness of 0.003 μm were created and evaluated together with non-oxidizing atmosphere gas conditions, and results are shown in Tables 1 and 2. Also, bonding wires with an outside diameter of 20 μm, a coating layer thickness of 0.06 μm, and a skin layer thickness of 0.003 μm were created, and evaluated together with non-oxidizing atmosphere gas conditions, and results are shown in Tables 3 and 4. In Tables 1 to 4, "Wire A" indicates bonding wires provided with a coating layer and skin layer over the surface of the core material while "Wire B" indicates bonding wires provided with a coating layer (without any skin layer) over the surface of the core material.

TABLE 1

| | | | Non-oxidizing atmosphere gas conditions | | | Evaluation results | | | |
| | | | | Hydrocarbon | Hydrogen | Wire A | | Wire B | |
| | Sample No. | Hydrocarbon type | concentration [vol %] | concentration [vol %] | Nitrogen | Pd distribution | FAB shape | Pd distribution | FAB shape |
|---|---|---|---|---|---|---|---|---|---|
| Example | 1 | Methane | 0.25 | 0.0 | Balance | Δ | Δ | Δ | ○ |
| | 2 | | 0.25 | 1.0 | Balance | ○ | ○ | Δ | ◎ |
| | 3 | | 0.25 | 2.5 | Balance | ○ | ○ | Δ | ◎ |
| | 4 | | 0.25 | 5.0 | Balance | ○ | ○ | Δ | ◎ |
| | 5 | | 1.25 | 0.0 | Balance | ○ | Δ | ○ | Δ |
| | 6 | | 1.25 | 1.0 | Balance | ◎ | ○ | ◎ | ○ |
| | 7 | | 1.25 | 2.5 | Balance | ◎ | ○ | ◎ | ○ |
| | 8 | | 1.25 | 5.0 | Balance | ◎ | ○ | ◎ | ○ |
| | 9 | | 6.25 | 0.0 | Balance | ○ | Δ | ○ | Δ |
| | 10 | | 6.25 | 1.0 | Balance | ◎ | Δ | ◎ | Δ |
| | 11 | | 6.25 | 2.5 | Balance | ◎ | ○ | ◎ | ○ |
| | 12 | | 6.25 | 5.0 | Balance | ◎ | ○ | ◎ | ○ |
| | 13 | | 12.50 | 0.0 | Balance | ◎ | X | ◎ | X |
| | 14 | | 12.50 | 1.0 | Balance | ◎ | Δ | ◎ | Δ |
| | 15 | | 12.50 | 2.5 | Balance | ◎ | Δ | ◎ | Δ |
| | 16 | | 12.50 | 5.0 | Balance | ◎ | Δ | ◎ | Δ |
| | 17 | Ethane | 0.14 | 0.0 | Balance | Δ | Δ | Δ | ○ |
| | 18 | | 0.14 | 1.0 | Balance | ○ | ○ | Δ | ○ |
| | 19 | | 0.14 | 2.5 | Balance | ○ | ○ | Δ | ◎ |
| | 20 | | 0.14 | 5.0 | Balance | ○ | ○ | Δ | ◎ |
| | 21 | | 0.70 | 0.0 | Balance | ○ | Δ | ○ | Δ |
| | 22 | | 0.70 | 1.0 | Balance | ○ | Δ | ◎ | ○ |
| | 23 | | 0.70 | 2.5 | Balance | ○ | ○ | ○ | ○ |
| | 24 | | 0.70 | 5.0 | Balance | ◎ | ○ | ○ | ○ |
| | 25 | | 3.50 | 0.0 | Balance | ◎ | X | ◎ | X |
| | 26 | | 3.50 | 1.0 | Balance | ◎ | Δ | ◎ | Δ |
| | 27 | | 3.50 | 2.5 | Balance | ◎ | ○ | ◎ | ○ |
| | 28 | | 3.50 | 5.0 | Balance | ◎ | ○ | ◎ | ○ |
| | 29 | | 7.00 | 0.0 | Balance | ◎ | X | ◎ | X |
| | 30 | | 7.00 | 1.0 | Balance | ◎ | Δ | ◎ | Δ |
| | 31 | | 7.00 | 2.5 | Balance | ◎ | Δ | ◎ | Δ |
| | 32 | | 7.00 | 5.0 | Balance | ◎ | Δ | ◎ | Δ |
| | 33 | Propane | 0.10 | 0.0 | Balance | ○ | Δ | Δ | ○ |

TABLE 1-continued

| | | Non-oxidizing atmosphere gas conditions | | | Evaluation results | | | |
| | | Hydrocarbon | Hydrogen | | Wire A | | Wire B | |
| Sample No. | Hydrocarbon type | concentration [vol %] | concentration [vol %] | Nitrogen | Pd distribution | FAB shape | Pd distribution | FAB shape |
|---|---|---|---|---|---|---|---|---|
| 34 | | 0.10 | 1.0 | Balance | ○ | ○ | △ | ○ |
| 35 | | 0.10 | 2.5 | Balance | ○ | ○ | △ | ◎ |
| 36 | | 0.10 | 5.0 | Balance | ○ | ○ | △ | ◎ |
| 37 | | 0.50 | 0.0 | Balance | ◎ | △ | ○ | △ |
| 38 | | 0.50 | 1.0 | Balance | ◎ | △ | ○ | ○ |
| 39 | | 0.50 | 2.5 | Balance | ◎ | ○ | ○ | ○ |
| 40 | | 0.50 | 5.0 | Balance | ◎ | ○ | ○ | ○ |
| 41 | | 2.50 | 0.0 | Balance | ◎ | X | ◎ | X |
| 42 | | 2.50 | 1.0 | Balance | ◎ | △ | ◎ | △ |
| 43 | | 2.50 | 2.5 | Balance | ◎ | ○ | ◎ | ○ |
| 44 | | 2.50 | 5.0 | Balance | ◎ | ○ | ◎ | ○ |
| 45 | | 5.00 | 0.0 | Balance | ◎ | X | ◎ | X |
| 46 | | 5.00 | 1.0 | Balance | ◎ | △ | ◎ | △ |
| 47 | | 5.00 | 2.5 | Balance | ◎ | △ | ◎ | △ |
| 48 | | 5.00 | 5.0 | Balance | ◎ | △ | ◎ | △ |
| 49 | Butane | 0.08 | 0.0 | Balance | ○ | △ | △ | ○ |
| 50 | | 0.08 | 1.0 | Balance | ○ | ○ | △ | ○ |
| 51 | | 0.08 | 2.5 | Balance | ○ | ○ | △ | ◎ |
| 52 | | 0.08 | 5.0 | Balance | ◎ | ○ | △ | ◎ |
| 53 | | 0.40 | 0.0 | Balance | ◎ | △ | ○ | △ |
| 54 | | 0.40 | 1.0 | Balance | ◎ | △ | ○ | ○ |
| 56 | | 0.40 | 5.0 | Balance | ◎ | ○ | ○ | ○ |
| 57 | | 2.00 | 0.0 | Balance | ◎ | X | ◎ | X |
| 58 | | 2.00 | 1.0 | Balance | ◎ | △ | ◎ | △ |
| 59 | | 2.00 | 2.5 | Balance | ◎ | ○ | ◎ | ○ |
| 60 | | 2.00 | 5.0 | Balance | ◎ | ○ | ◎ | ○ |
| 61 | | 4.00 | 0.0 | Balance | ◎ | X | ◎ | X |
| 62 | | 4.00 | 1.0 | Balance | ◎ | △ | ◎ | △ |
| 63 | | 4.00 | 2.5 | Balance | ◎ | △ | ◎ | △ |
| 64 | | 4.00 | 5.0 | Balance | ◎ | △ | ◎ | △ |

TABLE 2

| | | Non-oxidizing atmosphere gas conditions | | | Evaluation results | | | |
| | | Hydrocarbon | Hydrogen | | Wire A | | Wire B | |
| | Sample No. | concentration [vol %] | concentration [vol %] | Nitrogen | Pd distribution | FAB shape | Pd distribution | FAB shape |
|---|---|---|---|---|---|---|---|---|
| Comparative example | 1 | — | 0 | 0.0 | Balance | X | △ | X | ○ |
| | 2 | — | 0 | 1.0 | Balance | X | ○ | X | ◎ |
| | 3 | — | 0 | 2.5 | Balance | △ | ○ | X | ◎ |
| | 4 | — | 0 | 5.0 | Balance | △ | ○ | X | ◎ |

TABLE 3

| | | | Non-oxidizing atmosphere gas conditions | | | Evaluation results | | | |
| | | | Hydrocarbon | Hydrogen | | Wire A | | Wire B | |
| | Sample No. | Hydrocarbon type | concentration [vol %] | concentration [vol %] | Nitrogen | Pd distribution | FAB shape | Pd distribution | FAB shape |
|---|---|---|---|---|---|---|---|---|---|
| Example | 65 | Methane | 0.25 | 0.0 | Balance | △ | △ | △ | ○ |
| | 66 | | 0.25 | 1.0 | Balance | ○ | ○ | △ | ◎ |
| | 67 | | 0.25 | 2.5 | Balance | ○ | ○ | △ | ◎ |

TABLE 3-continued

| | | Non-oxidizing atmosphere gas conditions | | | Evaluation results | | | |
|---|---|---|---|---|---|---|---|---|
| | | Hydrocarbon | Hydrogen | | Wire A | | Wire B | |
| Sample No. | Hydrocarbon type | concentration [vol %] | concentration [vol %] | Nitrogen | Pd distribution | FAB shape | Pd distribution | FAB shape |
| 68 | | 0.25 | 5.0 | Balance | ○ | ○ | Δ | ◎ |
| 69 | | 1.25 | 0.0 | Balance | ○ | Δ | ○ | Δ |
| 70 | | 1.25 | 1.0 | Balance | ◎ | ○ | ◎ | ○ |
| 71 | | 1.25 | 2.5 | Balance | ◎ | ○ | ◎ | ○ |
| 72 | | 1.25 | 5.0 | Balance | ◎ | ○ | ◎ | ○ |
| 73 | | 6.25 | 0.0 | Balance | ○ | Δ | ○ | Δ |
| 74 | | 6.25 | 1.0 | Balance | ◎ | Δ | ◎ | Δ |
| 75 | | 6.25 | 2.5 | Balance | ◎ | ○ | ◎ | ○ |
| 76 | | 6.25 | 5.0 | Balance | ◎ | ○ | ◎ | ○ |
| 77 | | 12.50 | 0.0 | Balance | ○ | X | ○ | X |
| 78 | | 12.50 | 1.0 | Balance | ◎ | Δ | ◎ | Δ |
| 79 | | 12.50 | 2.5 | Balance | ◎ | Δ | ◎ | Δ |
| 80 | | 12.50 | 5.0 | Balance | ◎ | Δ | ◎ | Δ |
| 81 | Ethane | 0.14 | 0.0 | Balance | Δ | Δ | Δ | ○ |
| 82 | | 0.14 | 1.0 | Balance | ○ | ○ | Δ | ○ |
| 83 | | 0.14 | 2.5 | Balance | ○ | ○ | Δ | ◎ |
| 84 | | 0.14 | 5.0 | Balance | ○ | ○ | Δ | ◎ |
| 85 | | 0.70 | 0.0 | Balance | ○ | Δ | ○ | Δ |
| 86 | | 0.70 | 1.0 | Balance | ◎ | Δ | ○ | ○ |
| 87 | | 0.70 | 2.5 | Balance | ◎ | ○ | ○ | ○ |
| 88 | | 0.70 | 5.0 | Balance | ◎ | ○ | ○ | ○ |
| 89 | | 3.50 | 0.0 | Balance | ◎ | X | ◎ | X |
| 90 | | 3.50 | 1.0 | Balance | ◎ | Δ | ◎ | Δ |
| 91 | | 3.50 | 2.5 | Balance | ◎ | ○ | ◎ | ○ |
| 92 | | 3.50 | 5.0 | Balance | ◎ | ○ | ◎ | ○ |
| 93 | | 7.00 | 0.0 | Balance | ◎ | X | ◎ | X |
| 94 | | 7.00 | 1.0 | Balance | ◎ | Δ | ◎ | Δ |
| 95 | | 7.00 | 2.5 | Balance | ◎ | Δ | ◎ | Δ |
| 96 | | 7.00 | 5.0 | Balance | ◎ | Δ | ◎ | Δ |
| 97 | Propane | 0.10 | 0.0 | Balance | ○ | Δ | Δ | ○ |
| 98 | | 0.10 | 1.0 | Balance | ○ | ○ | Δ | ○ |
| 99 | | 0.10 | 2.5 | Balance | ○ | ○ | Δ | ◎ |
| 100 | | 0.10 | 5.0 | Balance | ◎ | ○ | Δ | ◎ |
| 101 | | 0.50 | 0.0 | Balance | ◎ | Δ | ○ | Δ |
| 102 | | 0.50 | 1.0 | Balance | ◎ | Δ | ○ | ○ |
| 103 | | 0.50 | 2.5 | Balance | ◎ | ○ | ○ | ○ |
| 104 | | 0.50 | 5.0 | Balance | ◎ | ○ | ◎ | ○ |
| 105 | | 2.50 | 0.0 | Balance | ◎ | X | ◎ | X |
| 106 | | 2.50 | 1.0 | Balance | ◎ | Δ | ◎ | Δ |
| 107 | | 2.50 | 2.5 | Balance | ◎ | ○ | ◎ | ○ |
| 108 | | 2.50 | 5.0 | Balance | ◎ | ○ | ◎ | ○ |
| 109 | | 5.00 | 0.0 | Balance | ◎ | X | ◎ | X |
| 110 | | 5.00 | 1.0 | Balance | ◎ | Δ | ◎ | Δ |
| 111 | | 5.00 | 2.5 | Balance | ◎ | Δ | ◎ | Δ |
| 112 | | 5.00 | 5.0 | Balance | ◎ | Δ | ◎ | Δ |
| 113 | Butane | 0.08 | 0.0 | Balance | ○ | Δ | Δ | ○ |
| 114 | | 0.08 | 1.0 | Balance | ○ | ○ | Δ | ○ |
| 115 | | 0.08 | 2.5 | Balance | ○ | ○ | Δ | 0 |
| 116 | | 0.08 | 5.0 | Balance | ◎ | ○ | Δ | 0 |
| 117 | | 0.40 | 0.0 | Balance | ◎ | Δ | ○ | Δ |
| 118 | | 0.40 | 1.0 | Balance | ◎ | Δ | ○ | ○ |
| 119 | | 0.40 | 2.5 | Balance | ◎ | ○ | ○ | ○ |
| 120 | | 0.40 | 5.0 | Balance | ◎ | ○ | ◎ | ○ |
| 121 | | 2.00 | 0.0 | Balance | ◎ | X | ◎ | X |
| 122 | | 2.00 | 1.0 | Balance | ◎ | Δ | ◎ | Δ |
| 123 | | 2.00 | 2.5 | Balance | ◎ | ○ | ◎ | ○ |
| 124 | | 2.00 | 5.0 | Balance | ◎ | ○ | ◎ | ○ |
| 125 | | 4.00 | 0.0 | Balance | ◎ | X | ◎ | X |
| 126 | | 4.00 | 1.0 | Balance | ◎ | Δ | ◎ | Δ |
| 127 | | 4.00 | 2.5 | Balance | ◎ | Δ | ◎ | Δ |
| 129 | | 4.00 | 5.0 | Balance | ◎ | Δ | ◎ | Δ |

TABLE 4

| | Sample No. | Non-oxidizing atmosphere gas conditions | | | Evaluation results | | | |
| | | Hydrocarbon concentration [vol %] | Hydrogen concentration [vol %] | Nitrogen | Wire A | | Wire B | |
| | | | | | Pd distribution | FAB shape | Pd distribution | FAB shape |
|---|---|---|---|---|---|---|---|---|
| Comparative example | 5 | — | 0 | 0.0 | Balance | X | Δ | X | ○ |
| | 6 | — | 0 | 1.0 | Balance | X | ○ | X | ⊚ |
| | 7 | — | 0 | 2.5 | Balance | Δ | ○ | X | ⊚ |
| | 8 | — | 0 | 5.0 | Balance | Δ | ○ | X | ⊚ |

As shown in Tables 1 and 3, it was verified that when the ball portion was formed in non-oxidizing atmosphere gas including hydrocarbon, it was possible to form ball portions with improved Pd coverage on the ball surfaces.

As shown in Nos. 1 to 16 and 65 to 80, it was verified that when 0.25 to 12.50 vol % of methane was included as a hydrocarbon, it was possible to form ball portions with improved Pd coverage on the ball surfaces. Also, as shown in Nos. 5 to 16 and 69 to 80, when the concentration of methane was 1.25 vol % or above, the evaluation results of the Pd distribution were a single circle mark or higher regardless of the presence or absence of a skin layer.

As shown in Nos. 17 to 32 and 81 to 96, it was verified that when 0.14 to 7.00 vol % of ethane was included as a hydrocarbon, it was possible to form ball portions with improved Pd coverage on the ball surfaces. Also, as shown in Nos. 21 to 32 and 85 to 96, when the concentration of ethane was 0.70 vol % or above, the evaluation results of the Pd distribution were a single circle mark or higher regardless of the presence or absence of a skin layer.

As shown in Nos. 33 to 48 and 97 to 112, it was verified that when 0.10 to 5.00 vol % of propane was included as a hydrocarbon, it was possible to form ball portions with improved Pd coverage on the ball surfaces. Also, as shown in Nos. 37 to 48 and 101 to 112, when the concentration of propane was 0.50 vol % or above, the evaluation results of the Pd distribution were a single circle mark or higher regardless of the presence or absence of a skin layer.

As shown in Nos. 49 to 64 and 113 to 128, it was verified that when 0.08 to 4.00 vol % of butane was included as a hydrocarbon, it was possible to form ball portions with improved Pd coverage on the ball surfaces. Also, as shown in Nos. 53 to 64 and 117 to 128, when the concentration of butane was 0.40 vol % or above, the evaluation results of the Pd distribution were a single circle mark or higher regardless of the presence or absence of a skin layer.

Also, as shown in Nos. 2 to 4, 6 to 8, 10 to 12, 14 to 16, 18 to 20, 22 to 24, 26 to 28, 30 to 32, 34 to 36, 38 to 40, 42 to 44, 46 to 48, 50 to 52, 54 to 56, 58 to 60, 62 to 64, 66 to 68, 70 to 72, 74 to 76, 78 to 80, 82 to 84, 86 to 88, 90 to 92, 94 to 96, 98 to 100, 102 to 104, 106 to 108, 110 to 112, 114 to 116, 118 to 120, 122 to 124, 126 to 128, it was verified that when non-oxidizing atmosphere gas further included 1.0 vol % or above of hydrogen, ball formability was improved. Also, there was no difference in ball formability between when the hydrogen concentration was 2.5 vol % and when the hydrogen concentration was 5.0 vol %.

REFERENCE SIGNS LIST

1 Bonding wire
2 Discharge torch
3 Capillary
4 Gas nozzle
5 Non-oxidizing atmosphere gas

The invention claimed is:

1. A ball forming method for forming a ball portion at a tip of a bonding wire which includes a core material including Cu with a concentration of 50 at % or above, and a coating layer including Pd with a concentration of 50 at % or above and formed over a surface of the core material, the ball forming method comprising a step of forming the ball portion by heating with an arc discharge in non-oxidizing atmosphere gas including hydrocarbon which is gas at room temperature and atmospheric pressure.

2. The ball forming method according to claim 1, wherein a carbon number of the hydrocarbon is 1 to 4.

3. The ball forming method according to claim 1, wherein the hydrocarbon includes one or more of methane, ethane, propane, and butane.

4. The ball forming method according to claim 1, wherein a concentration of the hydrocarbon in the non-oxidizing atmosphere gas is 0.08 to 12.50 vol %.

5. The ball forming method according to claim 4, wherein a concentration of methane in the non-oxidizing atmosphere gas is 0.25 to 12.50 vol %.

6. The ball forming method according to claim 4, wherein a concentration of ethane in the non-oxidizing atmosphere gas is 0.14 to 7.00 vol %.

7. The ball forming method according to claim 4, wherein a concentration of propane in the non-oxidizing atmosphere gas is 0.10 to 5.00 vol %.

8. The ball forming method according to claim 4, wherein a concentration of butane in the non-oxidizing atmosphere gas is 0.08 to 4.00 vol %.

9. The ball forming method according to claim 1, wherein the non-oxidizing atmosphere gas includes hydrogen.

10. The ball forming method according to claim 9, wherein the non-oxidizing atmosphere gas includes the hydrocarbon, the hydrogen, and a balance being made up of nitrogen and incidental impurities.

11. The ball forming method according to claim 9, wherein a concentration of the hydrogen is 1.0 to 5.0 vol %.

* * * * *